(12) United States Patent
Fan

(10) Patent No.: US 8,925,883 B2
(45) Date of Patent: Jan. 6, 2015

(54) SLIDE ASSEMBLY

(75) Inventor: Chen-Lu Fan, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 304 days.

(21) Appl. No.: 13/528,924

(22) Filed: Jun. 21, 2012

(65) Prior Publication Data

US 2013/0044416 A1    Feb. 21, 2013

(30) Foreign Application Priority Data

Aug. 16, 2011    (TW) .............................. 100129295 A

(51) Int. Cl.
*H05K 1/16*    (2006.01)
*H05K 7/14*    (2006.01)

(52) U.S. Cl.
CPC .................................. *H05K 7/1489* (2013.01)
USPC ....................... 248/222.13; 361/727; 312/333

(58) Field of Classification Search
CPC ... H05K 7/1489; A47B 88/04; A47B 88/0418
USPC ...................... 361/727; 248/223.13
See application file for complete search history.

(56) References Cited

U.S. PATENT DOCUMENTS

| | | | |
|---|---|---|---|
| 6,209,979 B1 * | 4/2001 | Fall et al. | 312/330.1 |
| 6,230,903 B1 * | 5/2001 | Abbott | 211/26 |
| 6,424,534 B1 * | 7/2002 | Mayer et al. | 361/724 |
| 6,891,727 B2 * | 5/2005 | Dittus et al. | 361/724 |
| 6,948,691 B2 * | 9/2005 | Brock et al. | 248/222.13 |
| 2005/0206284 A1 * | 9/2005 | Dubon et al. | 312/333 |
| 2009/0219701 A1 * | 9/2009 | Wu et al. | 361/727 |
| 2010/0019638 A1 * | 1/2010 | Duan et al. | 312/334.44 |
| 2011/0192946 A1 * | 8/2011 | Yu et al. | 248/222.11 |
| 2012/0161599 A1 * | 6/2012 | Chen et al. | 312/333 |
| 2012/0193489 A1 * | 8/2012 | Yu et al. | 248/201 |

* cited by examiner

*Primary Examiner* — Anthony Q Edwards
(74) *Attorney, Agent, or Firm* — Novak Druce Connolly Bove + Quigg LLP

(57) ABSTRACT

A slide assembly includes an inner slide, a fastening member configured to receive an electronic device, a locking member comprising a locking slice slidably mounted on the inner slide and an elastic member mounted between the inner slide and the locking slice. A receiving slot is defined in the locking slice. A mounting slice extending horizontally from the receiving slot towards a first distal end of the locking slice. The fastening member abuts the mounting slice to elastically deform the elastic member. The fastening member is slid into the receiving slot. When the elastic member elastically returns, the fastening member is restricted in the receiving slot by the mounting slice.

18 Claims, 6 Drawing Sheets

SLIDE ASSEMBLY

BACKGROUND

1. Technical Field

The present disclosure relates to a slide assembly for preventing an electronic device from falling off.

2. Description of Related Art

A three-section slide for a server unit includes an inner slide, an outer slide, and a third slide. A slide-aiding ball member is sandwiched between any two of the inner slide, the outer slide, and the third slide to enable a smooth sliding movement. The inner slide and the outer slide have a retaining member and a stop member mounted thereon respectively, for restricting movement. The retaining member is attached to an inner surface of the inner slide, and is provided with an engaging portion. The stop member is mounted to a front end of the outer slide, and is provided with a protrusion. When users draw out the inner slide from the outer slide, the protrusion of the stop member engages with the engaging portion of the retaining member to prevent accidental disassembly.

However, a user's hand may be caught and injured by the inner slide and the outer slide when the user directly disengages the engaging portion from the stop member to let the inner slide retract into the outer slide. Therefore, it may be inconvenient and dangerous for users to operate the slide.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
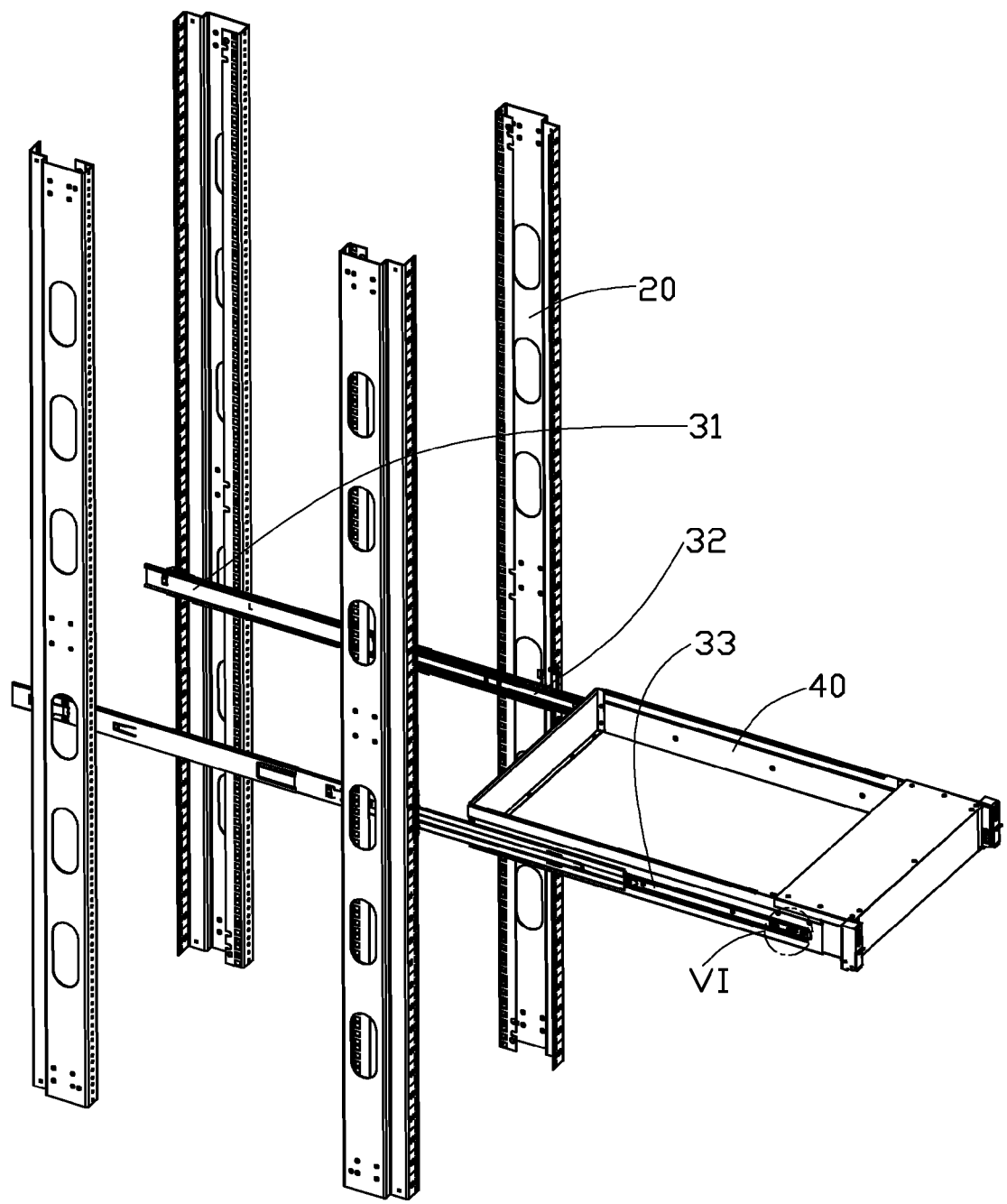
FIG. 1 is an assembled view of an embodiment of a slide assembly for mounting an electronic device, the slide assembly including a locking member, an elastic member, an outer slide, a middle slide, an inner slide and a fastening member.
Figure 2:
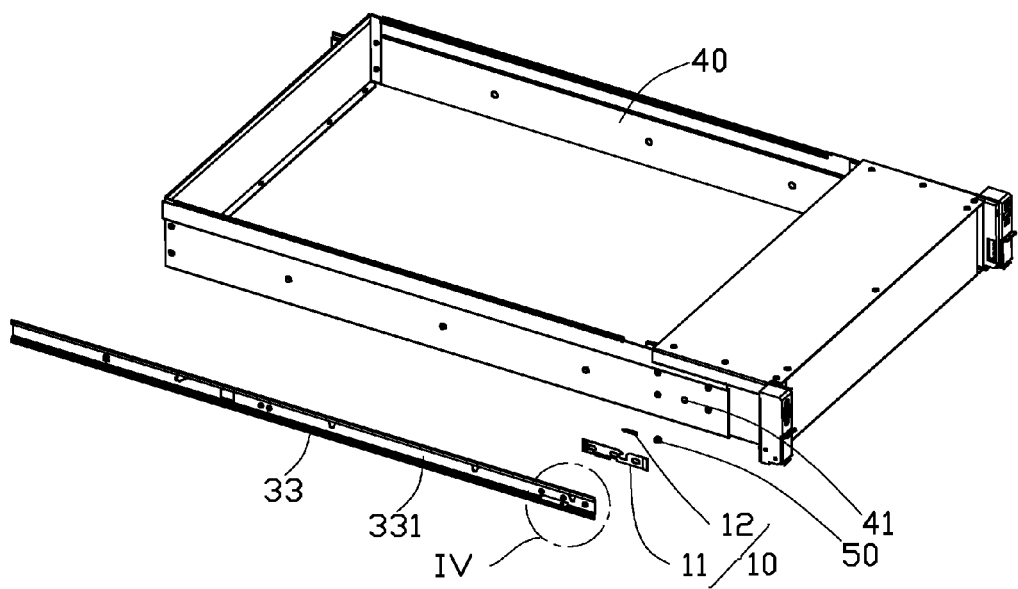
FIG. 2 is an exploded, isometric view of the locking member, the elastic member, the outer slide, the middle slide, the inner slide, the fastening member and the electronic device of FIG. 1.
Figure 3:
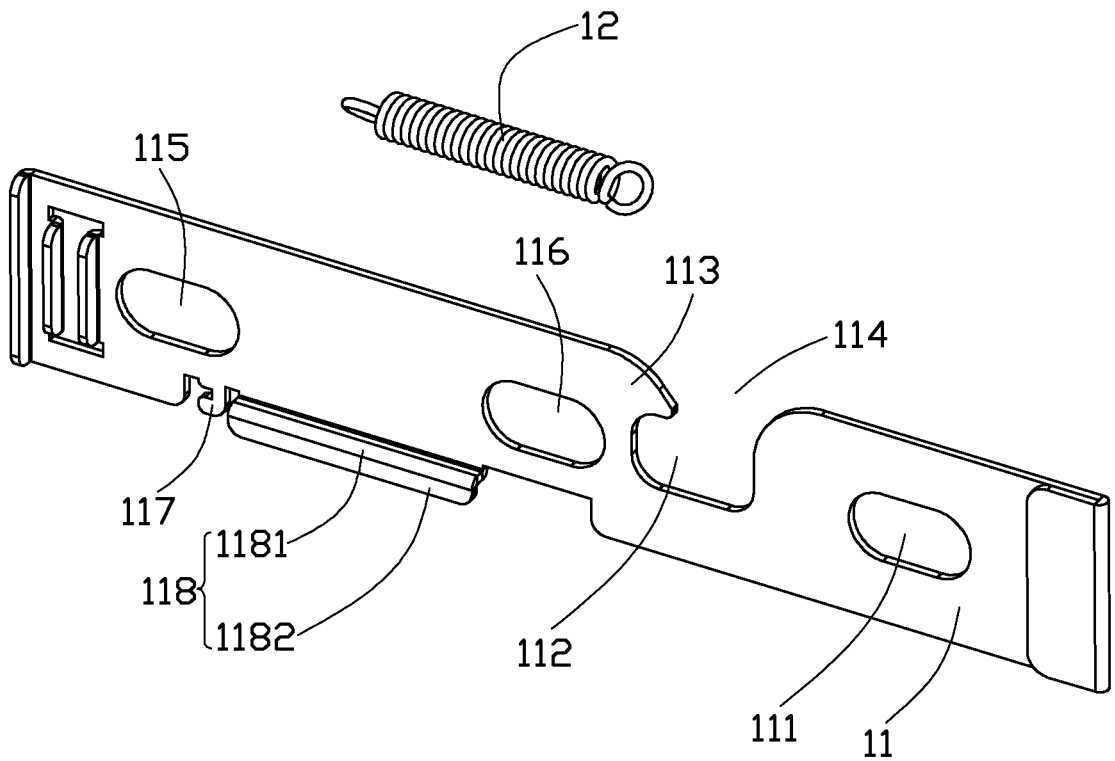
FIG. 3 is an isometric view of the locking slice and the elastic member of FIG. 2.
Figure 4:
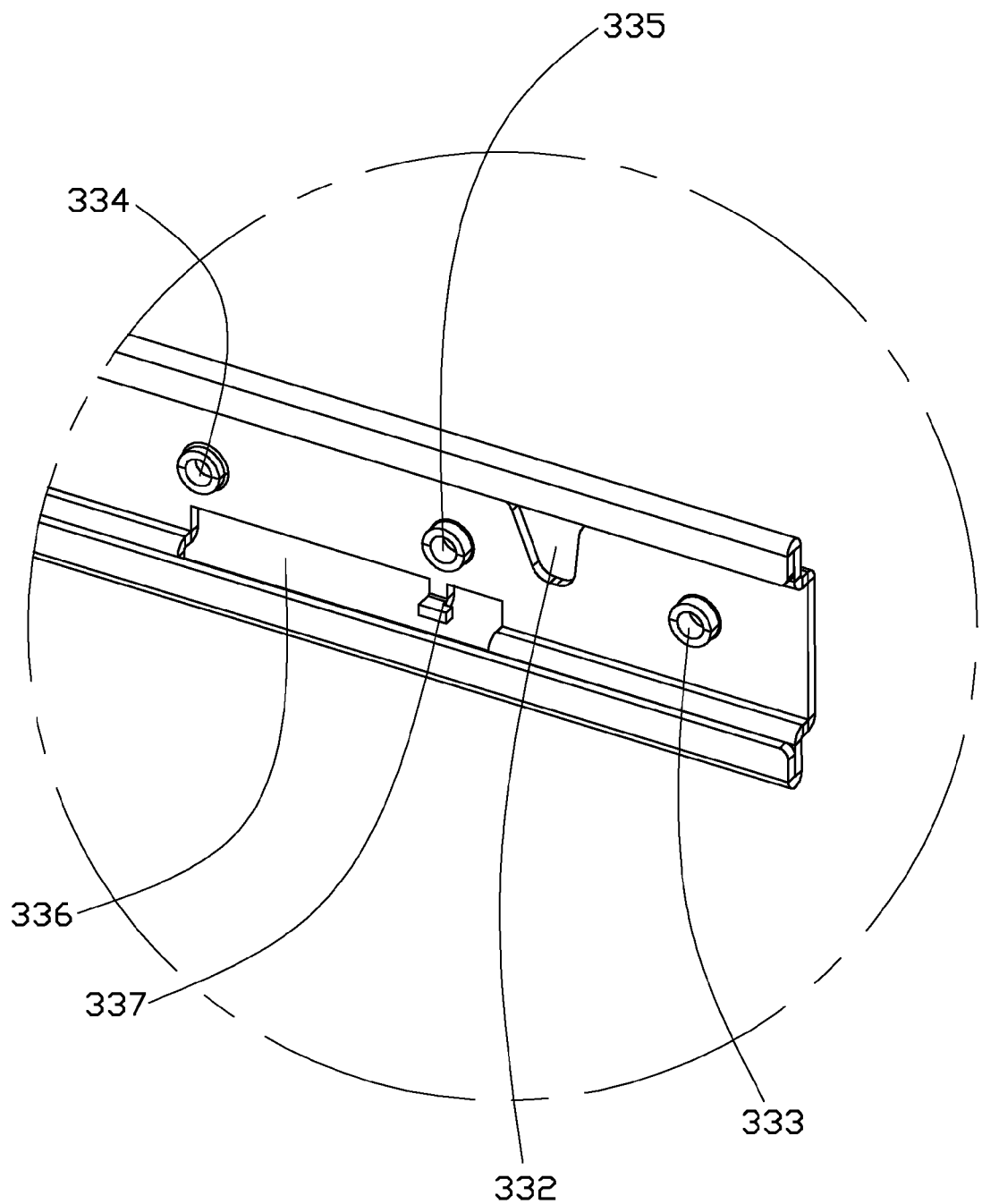
FIG. 4 is an enlarged view of a circled portion IV of FIG. 2.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIGS. 1 to 4, illustrate a slide assembly in accordance with an embodiment. The slide assembly is configured for receiving an electronic device 40. The slide assembly includes a locking member 10, an outer slide 31 mounted on a rack 20, a middle slide 32 mounted on the outer slide 31, an inner slide 33 mounted on the middle slide 32, and a fastening member 50 mounted on the electronic device 40. A fixing slot 331 is defined in the inner slide 33 for receiving the locking member 10. A locating slot 332 is defined in the fixing slot 331 corresponding to the fastening member 50. A circular fixing hole 41 is defined in the electronic device 40 for receiving the fastening member 50.

The locking member 10 includes a locking slice 11 and an elastic member 12. A rod-shaped first sliding slot 111 is defined in a first distal end of the locking slice 11. A receiving slot 112 is defined in the locking slice 11 adjacent to the first sliding slot 111. A mounting slice 113 extending horizontally from the receiving slot 112 towards the first distal end of the locking slice 11. An outer side of the mounting slice 113 is arc-shaped. A trapezoid-shaped opening 114 is defined in a top of the receiving slot 112. A rod-shaped second sliding slot 115 is defined in a second distal end of the locking slice 11. A rod-shaped third sliding slot 116 is defined in the locking slice 11 between the receiving slot 112 and the second sliding slot 115. A first hook 117 extending downwardly from a bottom edge adjacent to the second distal end of the locking slice 11. An accommodating portion 118 is located on the locking slice 11 adjacent to the first hook 117. The accommodating portion 118 includes a connecting wall 1181 extending perpendicularly from a bottom edge of the locking slice 11 and a sidewall 1182 extending downwardly from a side edge of the connecting wall 1181. The elastic member 12 is accommodated in the accommodating portion 118. In one embodiment, the elastic member 12 is a tension spring.

A column-shaped first guiding portion 333 is located on the fixing slot 331 corresponding to the first sliding slot 111. A column-shaped second guiding portion 334 is located on the fixing slot 331 corresponding to the second sliding slot 115. A column-shaped third guiding portion 335 is located on the fixing slot 331 corresponding to the third sliding slot 116. A rod-shaped connecting slot 336 is defined in the fixing slot 331 corresponding to the elastic member 12. A second hook 337 extending downwardly from an top edge of the connecting slot 336. In one embodiment, a width of the first sliding slot 111 is equal to a dimension of the first guiding portion 333; a width of the second sliding slot 115 is equal to a dimension of the second guiding portion 334; and a width of the third sliding slot 116 is equal to a dimension of the third guiding portion 335.

Figure 5:
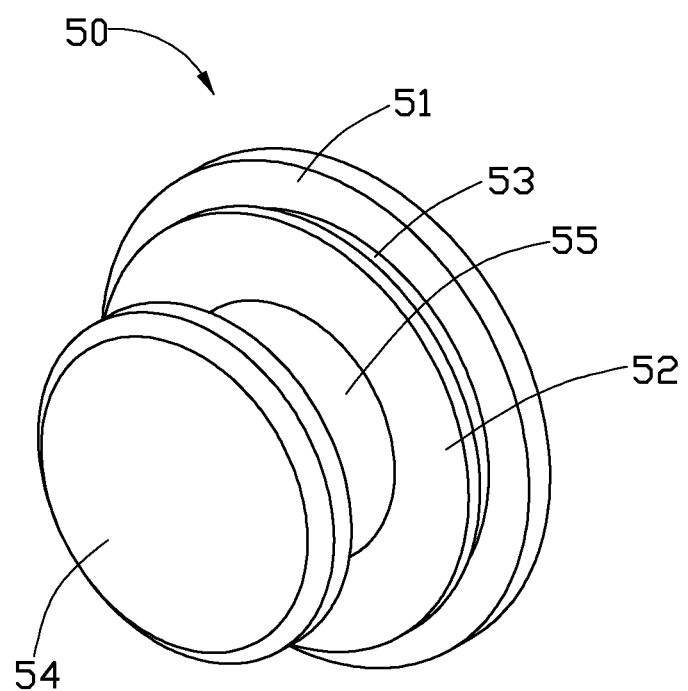
FIG. 5 is an isometric view of the fastening member of FIG. 2.

Referring to FIG. 5, the fastening member 50 includes a disc-shaped first locating portion 51, a disc-shaped second locating portion 52, a column-shaped first connecting portion 53 between the first locating portion 51 and the second locating portion 52, a disc-shaped fixing portion 54, and a column-shaped second connecting portion 55 between the second locating portion 52 and the fixing portion 54. The second locating portion 52 is received in the fixing hole 41. The fixing portion 54 and the second connecting portion 55 pass through the fixing hole 41 and extend outside of the electronic device 40. The first locating portion 51 abuts an inner surface of the electronic device 40. In one embodiment, a dimension of the first locating portion 51 is greater than a dimension of the fixing hole 41; a dimension of the second locating portion 52 is equal to a dimension of the fixing hole 41; a dimension of the fixing portion 54 is less than a width on a top of the locating slot 332; a dimension of the fixing portion 54 is greater than a width on a bottom of the locating slot 332; and a radius of the fixing portion 54 is equal to a length of the mounting slice 113 in the horizontal direction.

Figure 6:
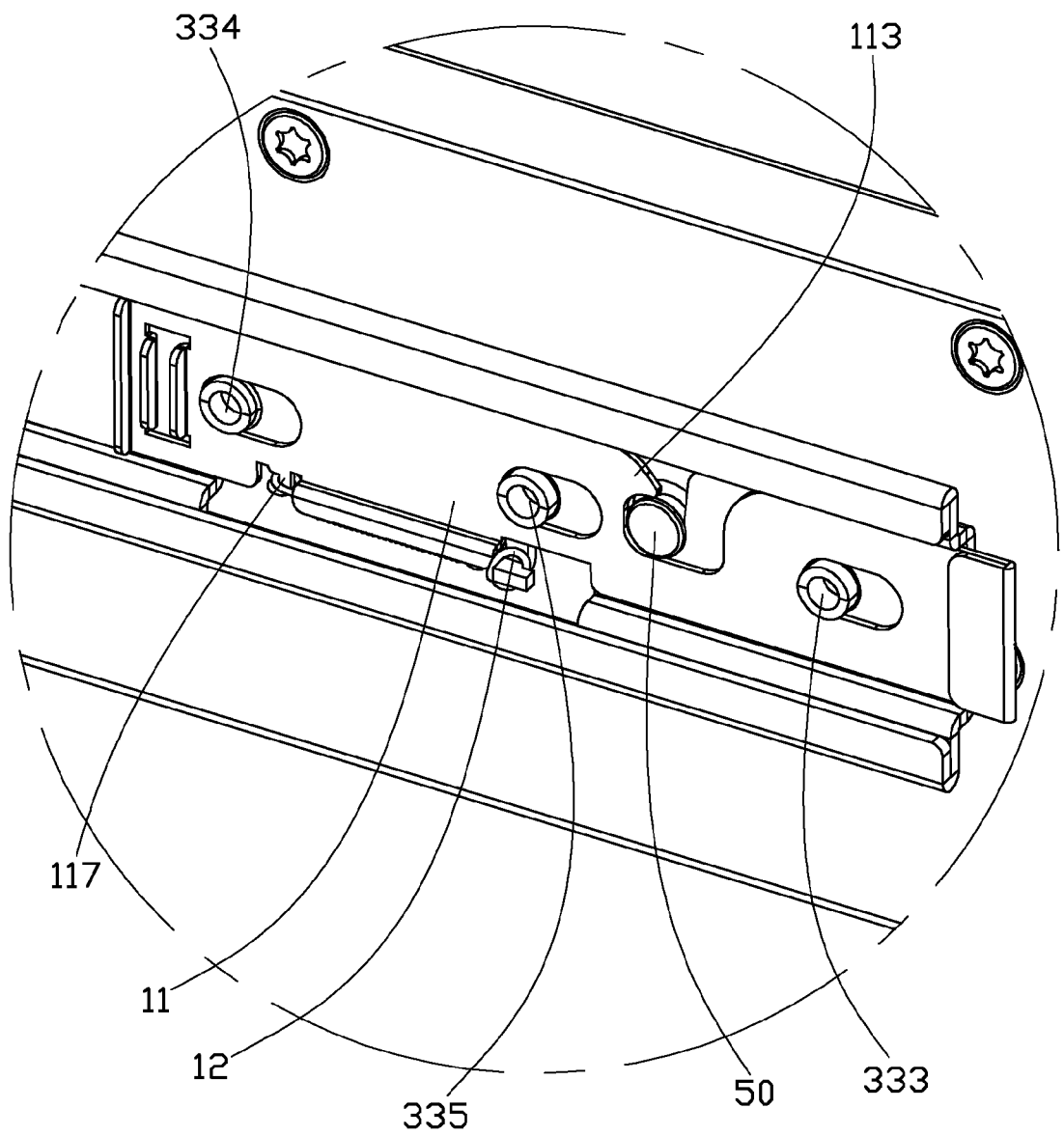
FIG. 6 is an enlarged view of a circled portion VI of FIG. 1.

Referring to FIG. 6, in assembly, to align the first guiding portion 333 with the first sliding slot 111, the first guiding portion 333 passes through and is slidably received in the first sliding slot 111. To align the second guiding portion 334 with the second sliding slot 115, the second guiding portion 334 passes through and is slidably received in the second sliding slot 115. To align the third guiding portion 335 with the third sliding slot 116, the third guiding portion 335 passes through and is slidably received in the third sliding slot 116. The first guiding portion 333 abuts a left side of the first sliding slot 111. The second guiding portion 334 abuts a left side of the second sliding slot 115. The third guiding portion 335 abuts a left side of the third sliding slot 116. Two distal ends of the elastic member 12 are mounted on the first hook 117 and the second hook 337 respectively. The locking slice 11 is mounted in the fixing slot 331. The elastic member 12 elastically stretches slightly to an original state.

When the electronic device 40 is mounted on the inner slide 33, the fastening member 50 is moved towards the opening 114. The second connecting portion 55 downwardly abuts the outer side of the mounting slice 113. The first distal end of the locking slice 11 is moved towards the second guiding portion 334 in the horizontal direction. The first guiding portion 333 is slid in the first sliding slot 111. The second guiding portion 334 is slid in the second sliding slot 115. The third guiding portion 335 is slid in the third sliding slot 116. The elastic member 12 elastically stretches. When the second connecting portion 55 does not abut the outer side of the mounting slice 113 and is slide into the receiving slot 112, the first distal end of the locking slice 11 moves away from the second guiding portion 334 in the horizontal direction. The elastic member 12 elastically returns to the original state.

The first guiding portion 333 is slid in the first sliding slot 111 until the first guiding portion 333 abuts the left side of the first sliding slot 111. The second guiding portion 334 is slid in the second sliding slot 115 until the second guiding portion 334 abuts the left side of the second sliding slot 115. The third guiding portion 335 is slid in the third sliding slot 116 until the third guiding portion 335 abuts the left side of the third sliding slot 116. A bottom edge of the second connecting portion 55 abuts the bottom of the locating slot 332. A top edge of the second connecting portion 55 abuts an inner side of the mounting slice 113. The fastening member 50 is mounted in the receiving slot 112 and the electronic device 40 is mounted on the inner slide 33.

When the electronic device 40 is released from the inner slide 33, the first distal end of the locking slice 11 is pulled and moved towards the second guiding portion 334 in the horizontal direction. The first guiding portion 333 is slid in the first sliding slot 111. The second guiding portion 334 is slid in the second sliding slot 115. The third guiding portion 335 is slid in the third sliding slot 116. The elastic member 12 elastically stretches until the mounting slice 113 no longer abuts the second connecting portion 55. The electronic device 40 is released from the inner slide 33.

Even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A slide assembly, comprising:
    an inner slide;
    a fastening member configured to be mounted on an electronic device;
    a locking member comprising a locking slice slidably mounted on the inner slide; a receiving slot defined in the locking slice; a mounting slice extending horizontally from the receiving slot towards a first distal end of the locking slice; and
    an elastic member mounted between the inner slide and the locking slice; wherein the fastening member abuts the mounting slice to elastically deform the elastic member; the fastening member is slid into the receiving slot; and when the elastic member elastically returns, the fastening member is restricted in the receiving slot by the mounting slice.

2. The slide assembly of claim 1, wherein a first hook extending downwardly from a bottom edge adjacent to a second distal end of the locking slice; a connecting slot is defined in the inner slide corresponding to the elastic member; a second hook extending downwardly from a top edge of the connecting slot; the elastic member is received in the connecting slot; and two distal ends of the elastic member are mounted on the first hook and the second hook respectively.

3. The slide assembly of claim 2, wherein an accommodating portion is located on the locking slice adjacent to the first hook; the accommodating portion comprises a connecting wall extending perpendicularly from a bottom edge of the locking slice and a sidewall extending downwardly from a side edge of the connecting wall; and the elastic member is accommodated in the accommodating portion.

4. The slide assembly of claim 1, wherein a locating slot is defined in the inner slide corresponding to the fastening member; and the fastening member passes through the locating slot to be mounted in the receiving slot.

5. The slide assembly of claim 2, wherein a rod-shaped first sliding slot is defined in the first distal end of the locking slice adjacent to the receiving slot; a rod-shaped second sliding slot is defined in the second distal end of the locking slice; a column-shaped first guiding portion is located on the inner slide corresponding to the first sliding slot; a column-shaped second guiding portion is located on the inner slide corresponding to the second sliding slot; and the first guiding portion is slid in the first sliding slot, the second guiding portion is slid in the second sliding slot when the fastening member abuts the mounting slice.

6. The slide assembly of claim 5, wherein a width of the first sliding slot is equal to a first dimension of the first guiding portion; and a width of the second sliding slot is equal to a second dimension of the second guiding portion.

7. The slide assembly of claim 5, wherein a rod-shaped third sliding slot is defined in the locking slice between the receiving slot and the second sliding slot; a column-shaped third guiding portion is located on the inner slide corresponding to the third sliding slot; and the third guiding portion is slid in the third sliding slot when the fastening member abuts the mounting slice.

8. The slide assembly of claim 7, wherein a width of the third sliding slot is equal to a third dimension of the third guiding portion.

9. The slide assembly of claim 8, wherein an outer side of the mounting slice is arc-shaped; the fastening member is circular; and a radius of the fastening member is equal to a length of the mounting slice in a horizontal direction.

10. A slide assembly, comprising:
    an inner slide;
    an electronic device comprising a fastening member mounted thereon; and
    a locking member comprising a locking slice slidably mounted on the inner slide; a receiving slot is defined in the locking slice; a mounting slice extending horizontally from the receiving slot towards a first distal end of the locking slice; and an elastic member mounted between the inner slide and the locking slice; wherein the fastening member abuts the mounting slice to elastically deform the elastic member; the fastening member is slid into the receiving slot; and when the elastic member elastically returns, the fastening member is restricted in the receiving slot by the mounting slice.

11. The slide assembly of claim 10, wherein a first hook extending downwardly from a bottom edge adjacent to a second distal end of the locking slice; a connecting slot is defined in the inner slide corresponding to the elastic member; a second hook extending downwardly from a top edge of the connecting slot; the elastic member is received in the connecting slot; and two distal ends of the elastic member are mounted on the first hook and the second hook respectively.

12. The slide assembly of claim 11, wherein an accommodating portion is located on the locking slice adjacent to the first hook; the accommodating portion comprises a connecting wall extending perpendicularly from a bottom edge of the locking slice and a sidewall extending downwardly from a side edge of the connecting wall; and the elastic member is accommodated in the accommodating portion.

13. The slide assembly of claim 10, wherein a locating slot is defined in the inner slide corresponding to the fastening member; and the fastening member passes through the locating slot to be mounted in the receiving slot.

14. The slide assembly of claim 11, wherein a rod-shaped first sliding slot is defined in the first distal end of the locking slice adjacent to the receiving slot; a rod-shaped second sliding slot is defined in the second distal end of the locking slice; a column-shaped first guiding portion is located on the inner slide corresponding to the first sliding slot; a column-shaped second guiding portion is located on the inner slide corresponding to the second sliding slot; and the first guiding portion is slid in the first sliding slot, the second guiding portion is slid in the second sliding slot when the fastening member abuts the mounting slice.

15. The slide assembly of claim 14, wherein a width of the first sliding slot is equal to a first dimension of the first guiding portion; and a width of the second sliding slot is equal to a second dimension of the second guiding portion.

16. The slide assembly of claim 14, wherein a rod-shaped third sliding slot is defined in the locking slice between the receiving slot and the second sliding slot; a column-shaped third guiding portion is located on the inner slide corresponding to the third sliding slot; and the third guiding portion is slid in the third sliding slot when the fastening member abuts the mounting slice.

17. The slide assembly of claim 16, wherein a width of the third sliding slot is equal to a third dimension of the third guiding portion.

18. The slide assembly of claim 17, wherein an outer side of the mounting slice is arc-shaped; the fastening member is circular; and a radius of the fastening member is equal to a length of the mounting slice in a horizontal direction.

* * * * *